United States Patent
Horng et al.

(10) Patent No.: US 11,145,339 B2
(45) Date of Patent: Oct. 12, 2021

(54) DEVICE AND METHOD FOR COMPUTING-IN-MEMORY

(71) Applicant: Taiwan Semiconductor Manufacturing Company, Ltd., Hsinchu (TW)

(72) Inventors: Jaw-Juinn Horng, Hsinchu (TW); Chin-Ho Chang, Hsinchu (TW); Yung-Chow Peng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/881,380

(22) Filed: May 22, 2020

(65) Prior Publication Data

US 2020/0381027 A1 Dec. 3, 2020

Related U.S. Application Data

(60) Provisional application No. 62/855,424, filed on May 31, 2019.

(51) Int. Cl.
*G11C 11/54* (2006.01)
*G11C 7/16* (2006.01)
(Continued)

(52) U.S. Cl.
CPC .............. *G11C 7/16* (2013.01); *G11C 7/062* (2013.01); *G11C 11/54* (2013.01); *G11C 13/003* (2013.01)

(58) Field of Classification Search
CPC ......... G11C 7/16; G11C 7/062; G11C 13/003; G11C 27/024; G11C 13/004;
(Continued)

(56) References Cited

U.S. PATENT DOCUMENTS

| 7,760,538 B1 * | 7/2010 | Paak | G11C 13/0004 365/148 |
| 2002/0050861 A1 * | 5/2002 | Nguyen | H03F 3/45197 330/254 |

(Continued)

OTHER PUBLICATIONS

Fahimi et al., "Mixed Signal Computing with Non-Volatile Memories," ECE Department, UC Santa Barbara, SRC Technical Conference (SRCTechCon' 18), 4 pages (2018).
(Continued)

*Primary Examiner* — Jay W. Radke
(74) *Attorney, Agent, or Firm* — Merchant & Gould P.C.

(57) ABSTRACT

A computing device and method are provided. The computing device in some examples includes multiple digital-to-analog converters (DACs) having outputs connected to respective operational amplifiers, with outputs connected to the gates of respective transistors, each forming a serial combination with a respective memory element. The serial combinations are connected between a voltage reference point and a conductive line. An analog-to-digital converter is connected to the conductive line at the input. The DACs generate analog signals having ON-period lengths corresponding to the respective numbers at the DACs' inputs. The transistors generate currents indicative of the levels of output signals of the respective DACs and memory states of the respective memory elements for the ON-periods. The combined currents charge or discharge the conductive line to a voltage indicative of the sum of the numbers weighted by the memory states. The voltage is converted to a digital representation of the weighted sum.

20 Claims, 11 Drawing Sheets

(51) Int. Cl.
*G11C 7/06* (2006.01)
*G11C 13/00* (2006.01)

(58) Field of Classification Search
CPC . G11C 13/0061; G11C 13/0026; G11C 16/26; G11C 16/32; G11C 16/24; G11C 11/54
See application file for complete search history.

(56) References Cited

U.S. PATENT DOCUMENTS

| | | | |
|---|---|---|---|
| 2004/0113829 A1* | 6/2004 | Nakamoto | H03M 1/08 341/159 |
| 2006/0255869 A1* | 11/2006 | Kawashima | H03K 3/0307 331/74 |
| 2007/0159870 A1* | 7/2007 | Tanizaki | G11C 11/5685 365/148 |
| 2008/0315068 A1* | 12/2008 | Kanda | H04N 5/374 250/200 |
| 2009/0058502 A1* | 3/2009 | Morosawa | G01J 1/32 327/514 |
| 2017/0004882 A1 | 1/2017 | Bateman | |
| 2018/0069536 A1 | 3/2018 | Roy et al. | |

OTHER PUBLICATIONS

Bavandpour et al., "Mixed-Signal Neuromorphic Inference Accelerators: Recent Results and Future Prospects," IEEE Internatinoal Electron Devices Meeting (IEDM), pp. 20.4.1-20.4.4 (2018).

* cited by examiner

DEVICE AND METHOD FOR COMPUTING-IN-MEMORY

CROSS-REFERENCE TO RELATED APPLICATIONS

The present application claims the benefit of U.S. Provisional Patent Application No. 62/855,424 titled "DAC/ADC Architecture for AI in Memory" filed May 31, 2019, the disclosure of which is hereby incorporated by reference in its entirety.

BACKGROUND

This disclosure relates generally to memory arrays used in data processing, such as multiply-accumulate operations. In certain memory arrays, the current through each memory cell is determined to ascertain the memory state of the cell. Due to the variations in certain characteristics of the memory cells, cell current can vary significantly. Effort are ongoing to minimize the cell current variation or the effect of such variation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In certain computational applications, such as neural networks or, more generally, artificial intelligence, and matrix operations, large numbers of computations involving large numbers memory cells are required. For example, a common type computation in neural network computations is "multiply-and-accumulate" ("MAC"), which involves multiplying the value (weight) stored in each memory element in a memory array, such as a column of memory cells, by an input value and summing up all the products. Such computation, if done in purely binary fashion, would involve a large amount of data movement and can thus lead to high power consumption. In certain analog or hybrid analog/binary schemes, certain operations, such as multiplications, can be carried out locally at the cell level, with certain values represented by currents passing through the memory element. Variations in resistance in such devices, such as the source-drain resistance of eflash cells or the resistance of a resistive random-access-memory ("RRAM") device, however, cause variations in currents through these devices. Such variations can be compensated, at least to a degree, but extra devices, such as capacitors, need to be used at least in some cases. Such devices can take up valuable space in integrated circuits ("IC") and consume power.

According to some aspects of this disclosure, current sources, such as operational-amplifier ("OPAMP")-based current sources can be used to ensure current consistency. In some embodiments, a computing device includes an array (e.g., a column) of memory elements; a conductive line extending along the array; and an array of transistors (e.g., metal-oxide-semiconductor ("MOS") transistors such as MOS field-effect transistors ("MOSFETs")), each paired with a respective one of the memory elements. Each of the memory element-transistor pair forms a serial combination with (e.g., the source-drain path of an eflash device in series with the source-drain path of a MOS transistor); the serial combination is connected between a first voltage reference point (e.g., ground) and the conductive line. The computing device further includes an array of amplifiers (e.g., OPAMP, such as StrongARM), with the output of each of the amplifiers connected to the control end of a respective transistor in the array.

According to some embodiments, the computing device outlined above can further include a replica array of memory elements paired with transistors interposed between the array of amplifiers and the array of memory element-transistor pairs connected to the conductive line.

According to some embodiments, a computing method includes converting an array of digital (binary) numbers to an array of analog signals, each having an ON-period, the length of which corresponds to the respective number; generating a set of currents, each through a respective one of a memory cell in an array of memory cells, each of which in a respective memory state (e.g., 1 or 0), each of the currents having a magnitude corresponding to a combination of respective number and the memory state of the respective memory cell (e.g., the product between the number and the value or weight (1 or 0) stored in the memory cell). The method further includes generating an analog signal (e.g., a voltage) on a conductive line by charging or discharging the conductive line with the currents; and converting the analog signal to a first digital output signal.

In some embodiments, the computing device outlined above further includes a second array of serial pairs of memory elements and transistors. Each of the memory element-transistor pair in the second array is serially connected to a respective memory element-transistor pair in the first array but arranged in reverse order along the array. One end of the memory element-transistor pair in the second array is connected to a respective memory element-transistor pair in the first array and to the conductive line; the other memory element-transistor pair in the second array is connected to another voltage reference point (e.g., rail voltage (VDD)). In some embodiments, the method outlined above further includes, generating a second set of currents (e.g., in the second array of memory element-transistor pairs); and after charging the conductive line to generate an analog signal (e.g., by the set of currents generated by the first array of memory element-transistor pairs), discharging the conductive line to generate another analog signal.

Figure 1:
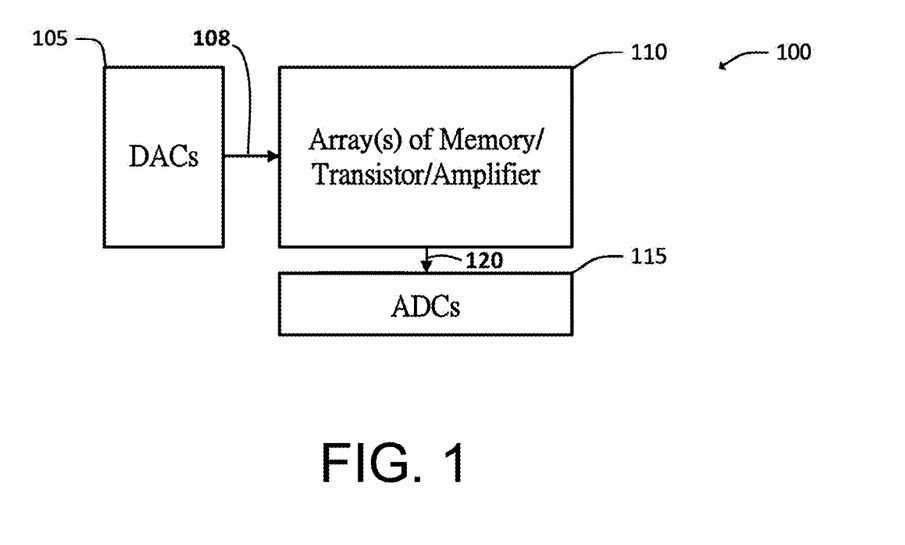
FIG. 1 is a block diagram illustrating an example of a computing device having a digital-to-analog and analog-to-digital converters (DACs/ADCs) in accordance with some embodiments.

Turning to more specific examples, as schematically illustrated in FIG. 1, a computing device (100) in some embodiments includes a set of digital-to-analog converters (DACs) (105), with their outputs (108) connected to a set (110) of memory elements, transistors and amplifiers, which are arranged in one or more arrays and connected to one or more conductive lines (120). The one or more conductive lines (120) are connected to one or more analog-to-digital converters (ADCs).

Figure 2:
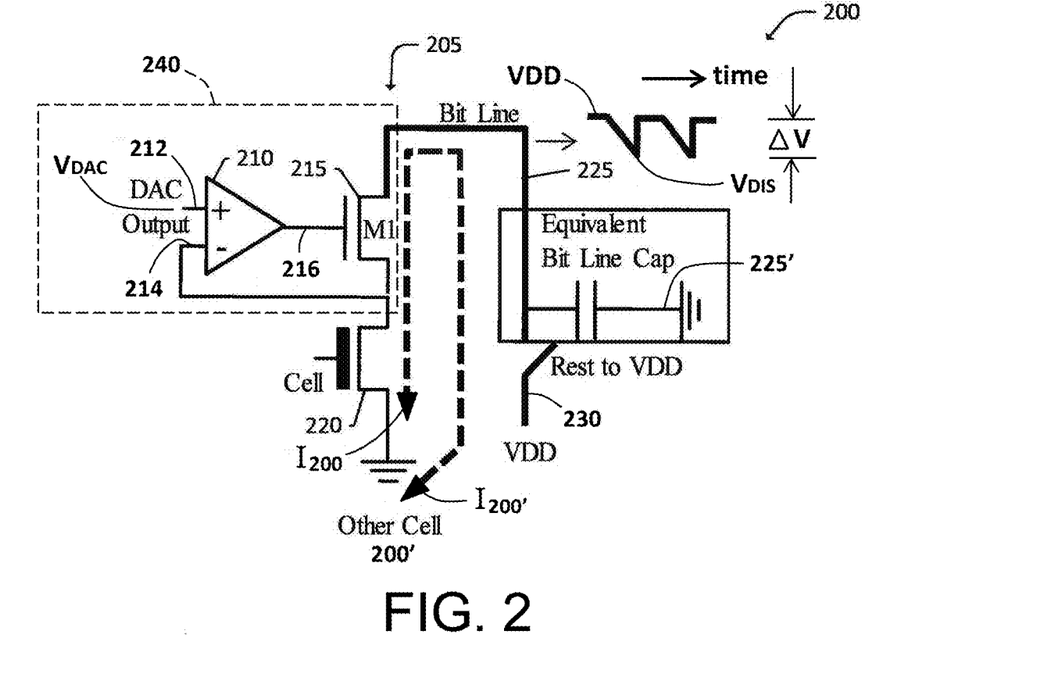
FIG. 2 is a circuit diagram illustrating a direct control switch bit cell in accordance with some embodiments.

More specifically, in some embodiments, such as the one illustrated in FIG. 2, a unit (200) of the array (110) includes a memory element-transistor pair (205), which includes a transistor (215) and a memory element (220) in serial connection with each other, i.e., the current path (e.g., the active region between source and drain of a MOSFET) of the transistor (215) and the current path (e.g., the current path between source and drain of an eflash or the current path of an RRAM element) in the memory element (220) connected to each other in series. The unit (200) further includes a conductive line (225), in certain applications known as a "bit line," which is shared with other units (200') (not shown in FIG. 2) of the array (110). The memory element-transistor pair (205) is connected between a first voltage reference point, the ground in this example, and the bit line (225). In this example, the transistor (215) is connected to the bit line (225), and the memory element (220) is connected to the voltage reference point, but the order can be reversed, with the transistor (215) connected to the voltage reference point, and the memory element (220) connected to the bit line (225). The bit line (225) is also connected to a second voltage reference point, in this example the rail voltage (VDD), locally, i.e., in the vicinity of the unit (200), through a switching device (230), such as a switching transistor.

The memory element (220) in this example has at least two memory states, which may be arbitrarily referred to as "1" and "0," respectively. In this example, the two states correspond to a relatively high resistance and relatively low resistance, respectively.

The bit line (225) in this example has a parasitic capacitance and thus acts as a capacitor (225'). In some embodiments, the bit line (225) is configured to by itself provide sufficient capacitance for the intended operation of each unit (200, 200'). In other embodiments, additional capacitors (not shown) can be fabricated between the bit line (225) and the first voltage reference point, to be in parallel with the parasitic capacitance of the bit line (225).

The unit (200) in this example further includes an amplifier (210), such as an operational amplifier ("OPAMP"). The OPAMP (210) in this case has an output (216) connected to the control end (such as the gate of a MOSFET) of the transistor (215), a non-inverting input (212) and an inverting input (214). The inverting input (214) in this example is connected to the junction between the transistor (215) and the memory element (220). The non-inverting input (212) is connected to the output of the DAC (108). The OPAMP (210) and transistor (215) in this example form a current source (240), which produces a current $I_{200}$, which drains electrical charge from the bit line (225). The magnitude of the current 1200 in this example is proportional to the voltage ($V_{DAC}$) of the DAC output (108) when the memory element (220) conducts (i.e., in the relatively low resistance state, or "0" state). Similarly, the other unit(s) (200') connected to the same bit line (225) drains the bit line (225) with its current how.

All components in this example are fabricated as a part of an integrated circuit ("IC") such as a semiconductor chip. The transistor (215) in this example is an N-type MOSFET ("NMOS") but can be any other suitable transistor. For example, depending on the circuit configuration, a P-type MOSFET ("PMOS") can be used. The memory element (220) in this example is an eflash RRAM, but can be any other suitable memory device, such as suitable non-volatile memory element. The amplifier in this example is an OPAMP, such as a StrongARM amplifier, but can be any suitable amplifier.

Figure 3:
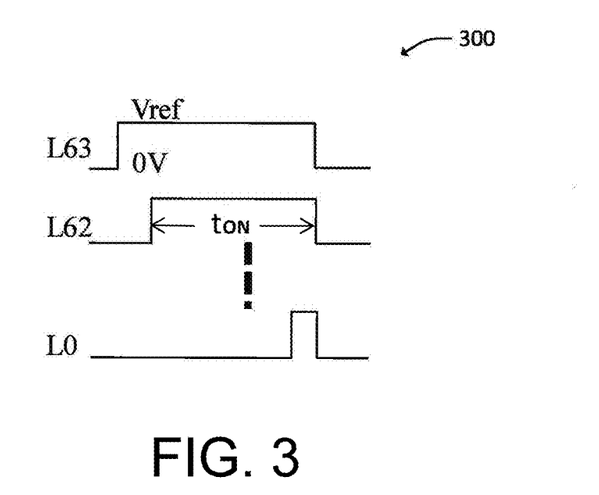
FIG. 3 is signal diagram illustrating example DAC output signals of the system in accordance with some embodiments.

In operation, in some embodiments, with reference to FIG. 3, during a charging period, the bit line (225) is initialized by turning off the transistor (215) and corresponding transistors in other unit(s) (200') and closing the switch (230) to charge the bit line (225) to the rail voltage (VDD). Thereafter, during a discharge period, the DACs (105) generate an output signal at the non-inverting input (212) of the OPAMP (210), thereby generating an OPAMP output signal at the output (216) of the OPAMP and, in turn, causing a current 1200 of a magnitude proportional to $V_{DAC}$ to flow from the bit line (225) to ground through the memory element (220) if the memory element (220) is in its "1" state.

In some embodiments, as illustrated in FIG. 3, the DAC output signal has a low level (0V) and a high level (a reference voltage, Vref). The DAC output signal is at the high level for an ON-period, $t_{ON}$, which corresponds (e.g., proportional) to the value of the binary number at the input of the DAC (105). For example, for a DAC input resolution of 64 (i.e., 6-bits), $t_{ON}$ in this example has 64 different values (level 0 (L0) through level 63 (L63)). Shorter $t_{ON}$ for smaller numbers serves to lower the power consumption of the DACs (105) and the OPAMPs (210).

The power consumption in some embodiments is lowered further by using a lower DAC output level. For example, a level shifter (notshown) can be used to shift the output level (which can be as high as VDD) to a lower level of Vref.

Thus, each unit (200, 200') drains the bit line (225) with a respective current $I_{200}$, $I_{200'}$ for a period $t_{ON}$ appropriate for that unit during the discharge period. The voltage of the bit line (255) thus decreases at a rate proportional to the total current of all units sharing the same bit line (225). The difference $\Delta V$, between the initial voltage, VDD, and the voltage, $V_{DIS}$, at the end of the discharge, is thus proportional to the sum of the values of the binary numbers at the DAC input, with each number weighted by the number (1 or 0) stored in the respective memory element. More generally, $V_{DIS}$ itself can be used to ascertain this weighted sum as long as the starting level of the voltage on the bit line is known. $V_{DIS}$ is then input into an ADC (115), which generates a digital representation of $V_{DIS}$ and is thus indicative of the weighted sum.

Figure 13:
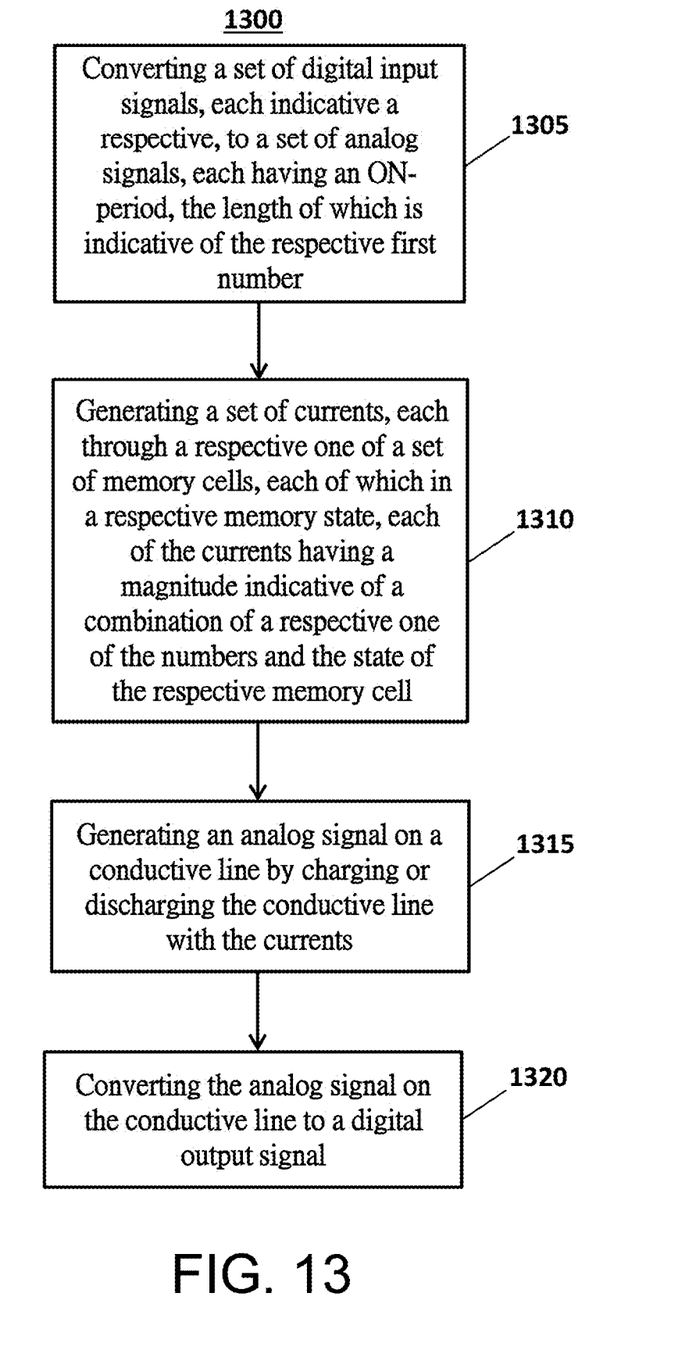
FIG. 13 is a flow chart illustrating a method of computing in accordance with some embodiments.

Thus, more generally, in some embodiments, a method (1300), as outlined in FIG. 13, includes the steps of: converting (1305) a set of digital input signals, each indicative a respective number, to a set of analog signals, each having an ON-period, the length of which is indicative of the respective number; generating (1310) a set of currents, each through a respective one of a set of memory cells, each of which in a respective memory state, each of the currents having a magnitude indicative of a combination of respective one of the numbers and the state of the respective memory cell; generating (1315) an analog signal on a conductive line by charging or discharging the conductive line with the currents; and converting (1320) the analog signal on the conductive line to a digital output signal.

In some embodiments, such as in the arrangement (615) in FIG. 6 (described in more details later in this disclosure) instead of connecting a memory element-transistor pair (205) between the ground and bit line (225), a memory element-transistor pair (205B) can be connected between a high voltage reference point (e.g., VDD) and bit line (225). In this case, the transistor (215B) can be a PMOS. In operation, instead of discharging the bit line (225), the current through memory element-transistor pair (205B) charges the bit line (225) to raise the bit line voltage from an initial level. The increase in the bit line voltage thus represents a weighted sum of the input signals.

Figure 4:
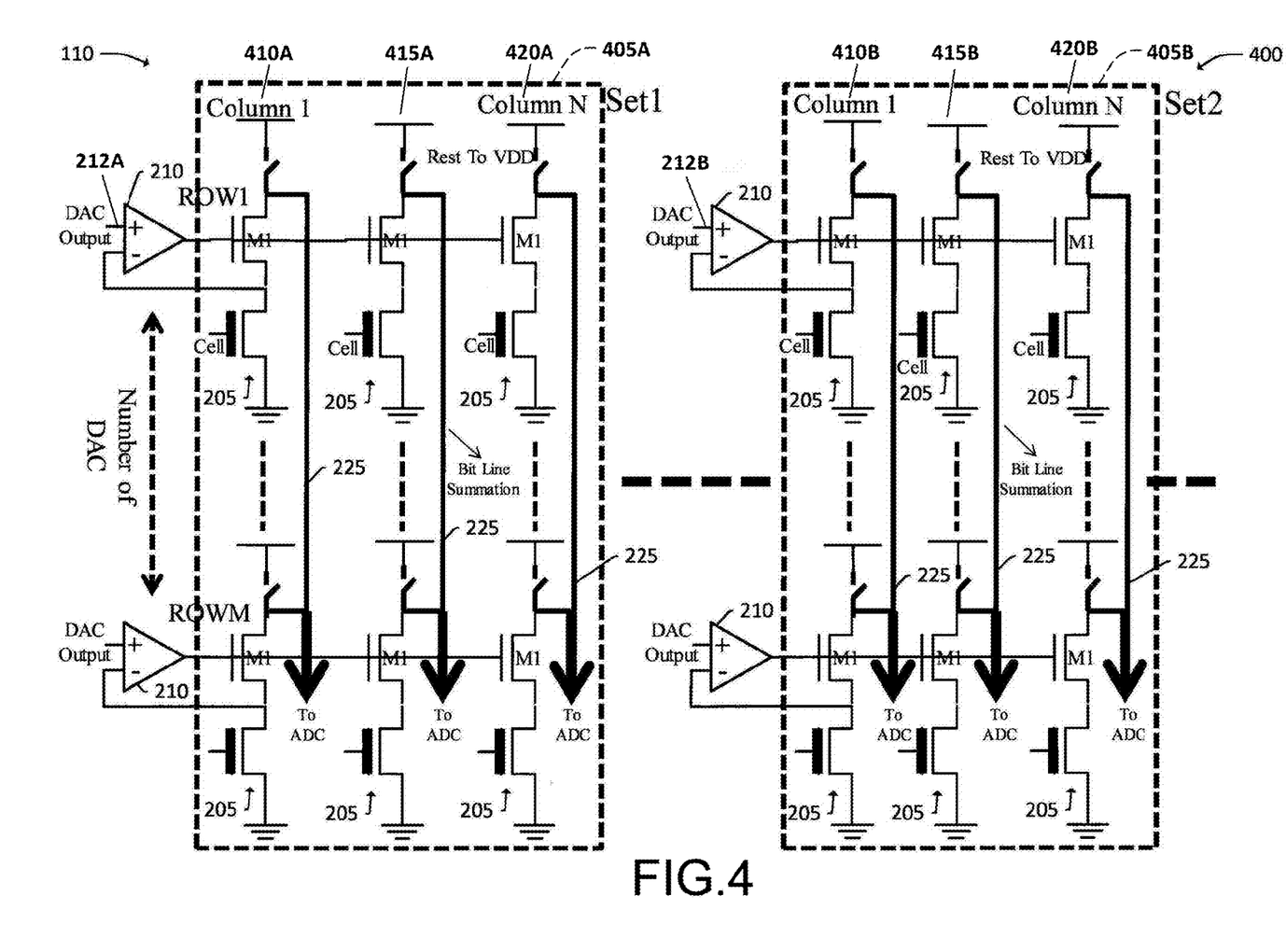
FIG. 4 is a circuit diagram illustrating an example computing device in accordance with some embodiments.

In some embodiments, a computing device (400) includes linear arrays, or columns (410A, 415A, 420A, 410B, 415B, 420B) of memory element-transistor pairs (205) and bit lines (225) extending along the respective columns. The multiple memory element-transistor pairs (205) in each column are arranged along the column and each connected between ground and the bit line (225) along the column. The memory element-transistor pairs (205) are thus arranged in one or more two-dimensional arrays or sets (405A, 405B) of multiple rows (1 through M in this example) and multiple columns (1 through N in this example). The memory element-transistor pairs (205) in each row of each two-dimensional array (405A, 405B) are commonly connected to an OPAMP (210) associated with that row. The amplifier (210) associated with each row is connected to a respective DAC (105); each bit line (225) is connected to a respective ADC (115). The OPAMPs (210) for different sets (405A, 405B) but same row (e.g., row 1) can share (i.e., have their inputs (212A, 212B) connected to) the same DAC output in some embodiments. Loading a single OPAMP with a large number (e.g., 2N) of memory element-transistor pairs (205) may cause an unacceptably large device mismatch. Dividing each row into a smaller number (e.g., N) of memory element-transistor pairs (205) reduces the mismatch to an acceptable level.

The computing device (400) thus can perform MAC operations on a set of (M) input numbers, producing a set of (e.g., N or 2N) output numbers. The MAC operations on each set of input number can be performed in parallel, i.e., within the same cycle of charge or discharge of the bit lines (225).

Figure 5:
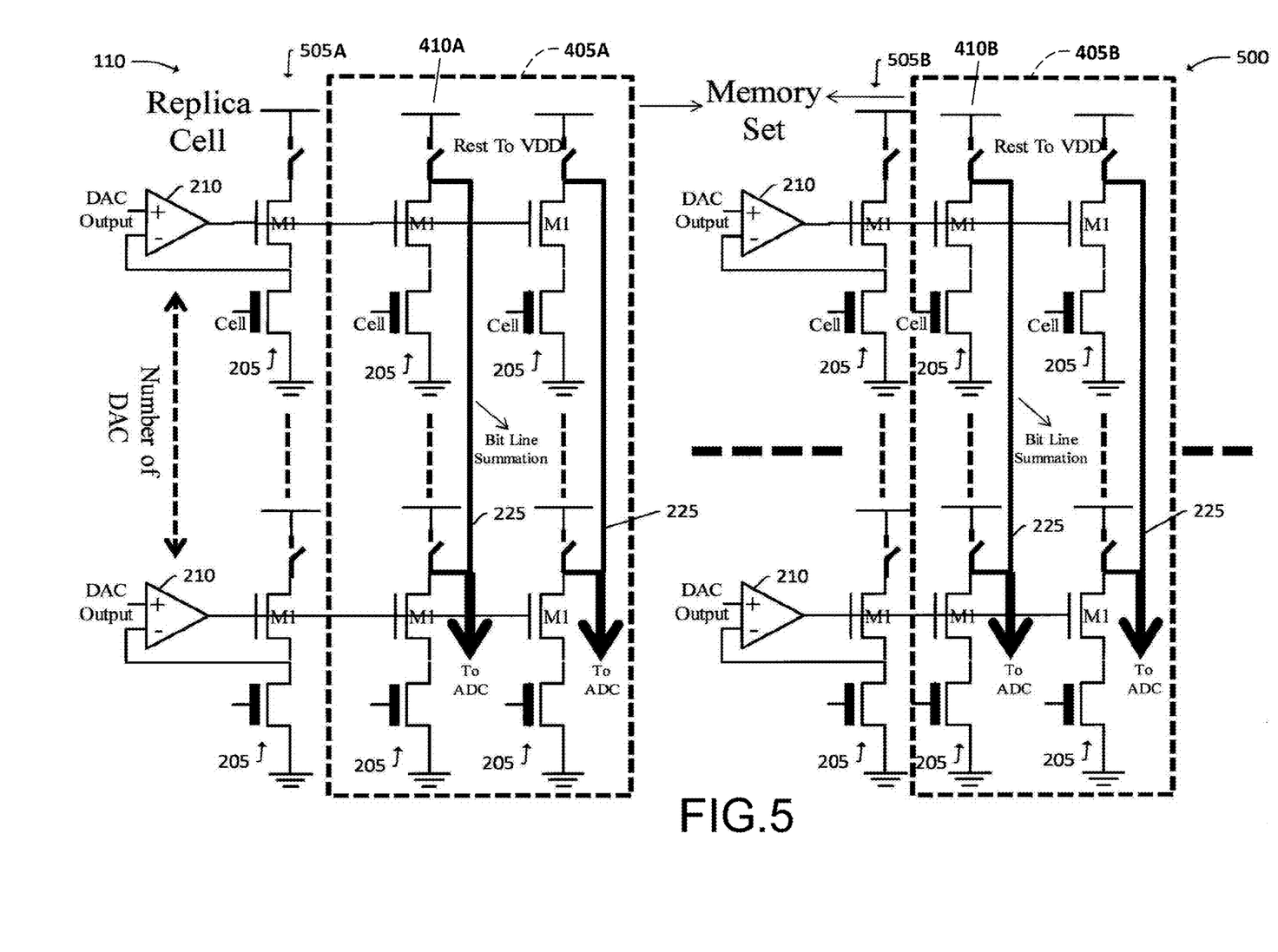
FIG. 5 is a circuit diagram illustrating another example computing device in accordance with some embodiments.

In some embodiment, such as the example computing device (500) shown in FIG. 5, a column (505A, 505B) of memory element-transistor pairs (205) is interposed between each set (405A, 405B) and the OPAMPs (210) associated with that set. The interposed memory element-transistor pairs (205) (hereinafter referred to as "replica cells") are otherwise identical to the memory element-transistor pairs (205) in each set (405A, 405B) and serve to provide an environment for the first column (410A, 410B) more similar to that of the remaining columns than if the first column (410A, 410B) were to be connected to the OPAMPs (210) without any intervening components. The matching characteristics between the first column (410A, 410B) and the OPAMPs (210) is more similar to matching characteristics between the remaining column and the OPAMPs (210).

Figure 6:
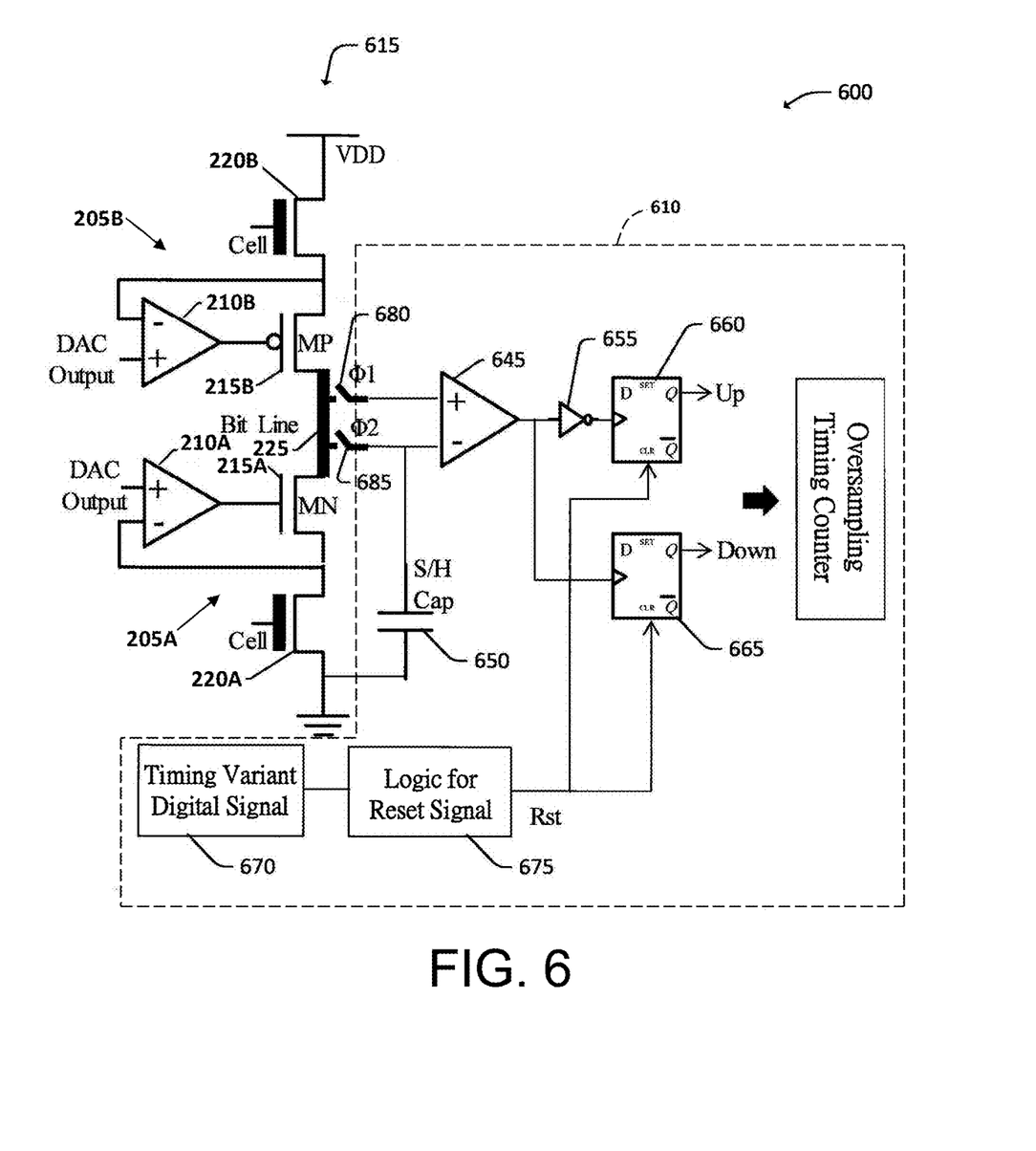
FIG. 6 is a circuit diagram illustrating an example charge/discharge based timing variant input cell device in accordance with some embodiments.
Figure 7:
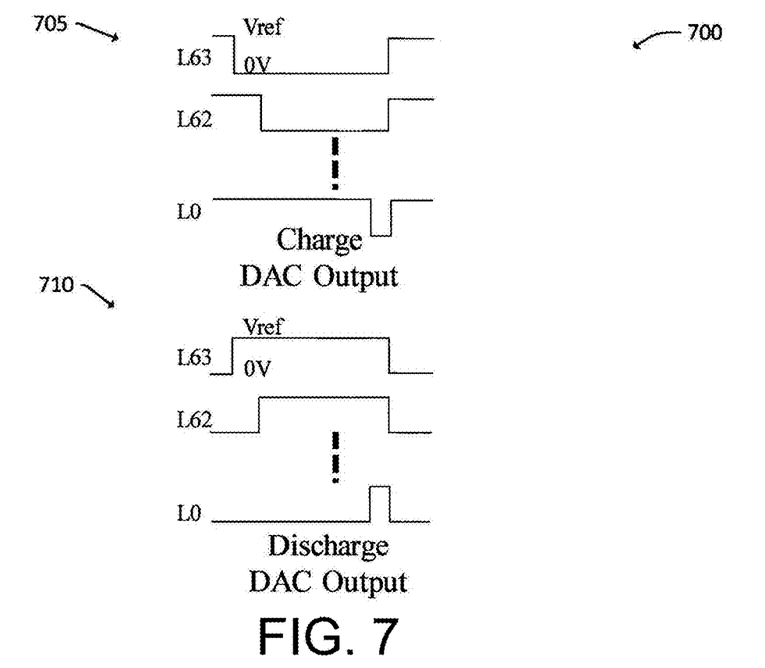
FIG. 7 is a signal diagram illustrating example DAC output signals of the device of FIG. 6 in accordance with some embodiments.

In some embodiments, such as the device (600) shown in FIG. 6, an arrangement (615) includes a memory element-transistor pair (205A) which is the same as the memory element-transistor pair (205) described above, connected between the ground and bit line (225), as well a memory element-transistor pair (205B) connected between a high voltage reference point (e.g., VDD) and bit line (225). As shown in FIG. 7, the transistor (215A) is driven by the time-variant DAC output (710) as described above; the transistor (215A) is driven by the inverted time-variant DAC output (705).

The voltage on the bit line (225) can be used in one example embodiment as inputs to a timing circuit (610), which includes a differential amplifier (645), which has switched noninverting input $\Phi 1$, an inverting input 12, both connected to the bit line (225) via respective switches (680, 685). A sample-and-hold capacitor (650) is connected between the inverting input $\Phi 2$ and ground. The output of the differential amplifier (645) connected to the input of a first D-type flip-flop (660) via an inverter (655) and to the input of a second D-type flip-flop (665). The clock signals to the clock inputs (CLK) of the D-type flip-flops (660, 665) are reset signals (Rst) supplied by a reset signal logic circuit (675), which is driving by a timing variant digital signal generator (670). The first and second D-type flip-flops (660, 665) output signals at the respective Q-outputs, which provide Up and Down signals, respectively, to a counter, which in this example is an Oversampling Timing Counter.

Figure 8:
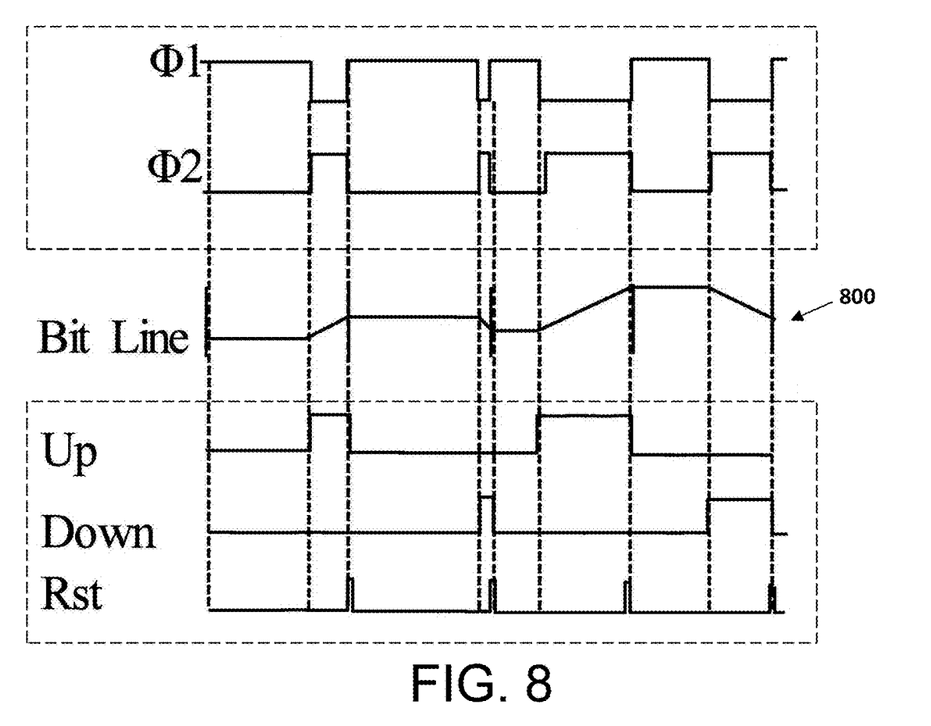
FIG. 8 is a signal diagram illustrating an example of the signal at the bit line in the circuit of FIG. 6 in accordance with some embodiments.

As described above, a current through the memory element-transistor pair (205A) discharges the bit line (225), and a current through the memory element-transistor pair (205B) charges the bit line (225). Thus, in some embodiments, discharge of the bit line (225) by the memory element-transistor pair (205A) in one operation (e.g., MAC computation) cycle can follow a charging of the bit line (225) by the memory element-transistor pair (205B) in the preceding operation (e.g., MAC computation) cycle instead of following an initialization. The bit line voltage, as shown in the example in FIG. 8, is thus continuous instead of having abrupt jumps (or have fewer such jumps) due to initialization, as shown in FIG. 2B. As the energy stored on the bit line (225) during the charging cycles is utilized by discharging cycles, initialization can be eliminated or reduced in number, and the computing device is more energy efficient.

Figure 9:
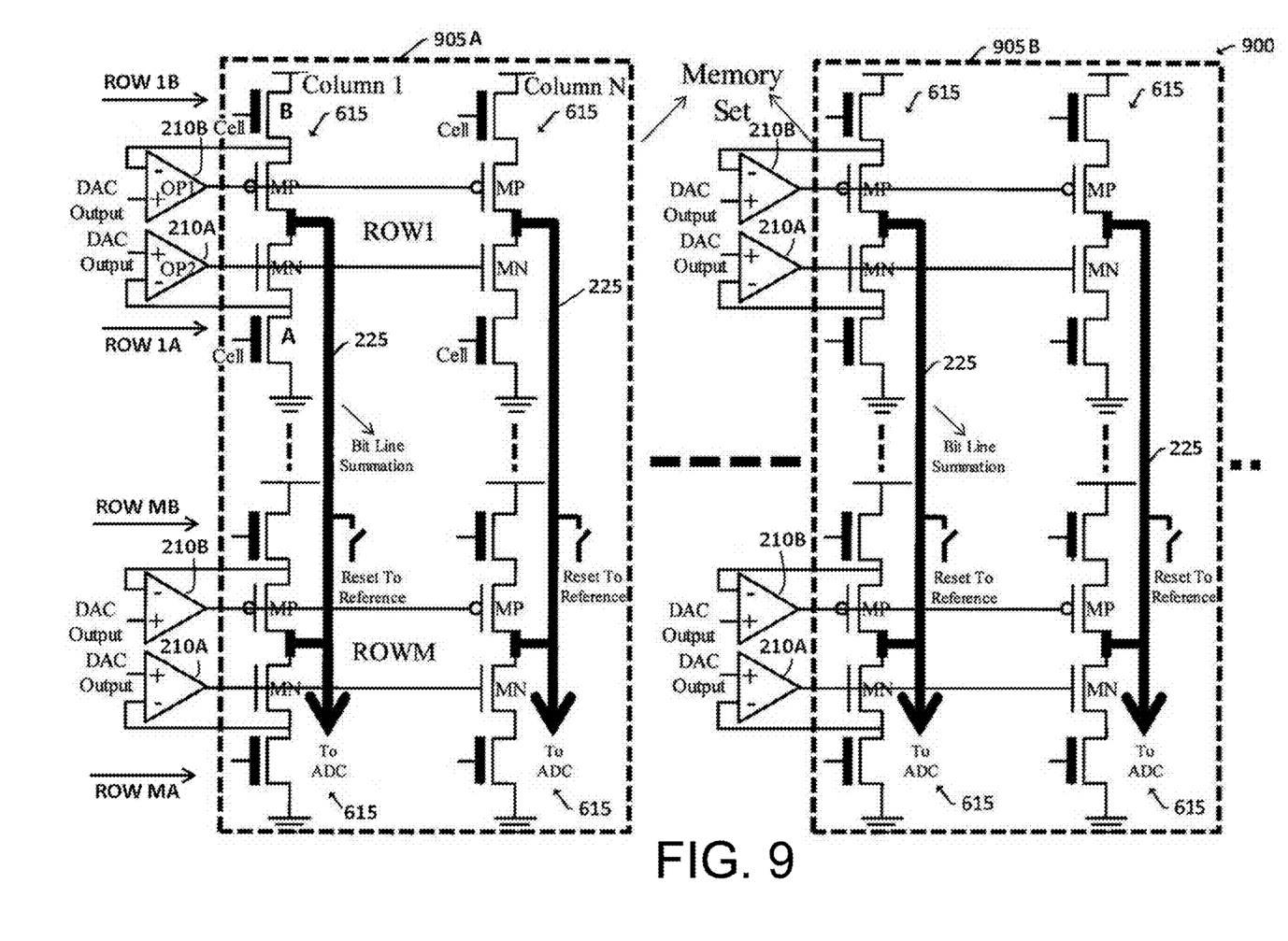
FIG. 9 is a circuit diagram illustrating another example computing device in accordance with some embodiments.

The arrangement (615) in FIG. 6 can be used in computing devices in some embodiments, such as the one (900) shown in FIG. 9. The computing device (900), including two-dimensional arrays (905A, 905B) of arrangement (615), is similar to the one (400) shown in FIG. 4, except that arrangements (615) are used instead of the memory element-transistor pairs (205). Put in another way, discharging memory element-transistor pairs (205B) are added to discharging memory element-transistor pairs (205, 205A).

In operation in some embodiments, a computation cycle, such as the MAC computation cycle described above, can be performed by the rows (e.g., Rows 1B through MB) of charging memory element-transistor pairs (205B). A subsequent computation cycle, such as the MAC computation cycle described above, can be performed by the rows (e.g., Rows 1A through MA) of charging memory element-transistor pairs (205B).

In some embodiments, similar to the computing device (500) shown in FIG. 5, a column (1005A, 1005B) of replica bit cells is interposed between each set (905A, 905B) in the computing device (900) shown in FIG. 9 and the OPAMPs (210A, 210B) associated with that set. The benefits of including replica bit cells are as described above in reference to FIG. 5.

Figure 10:
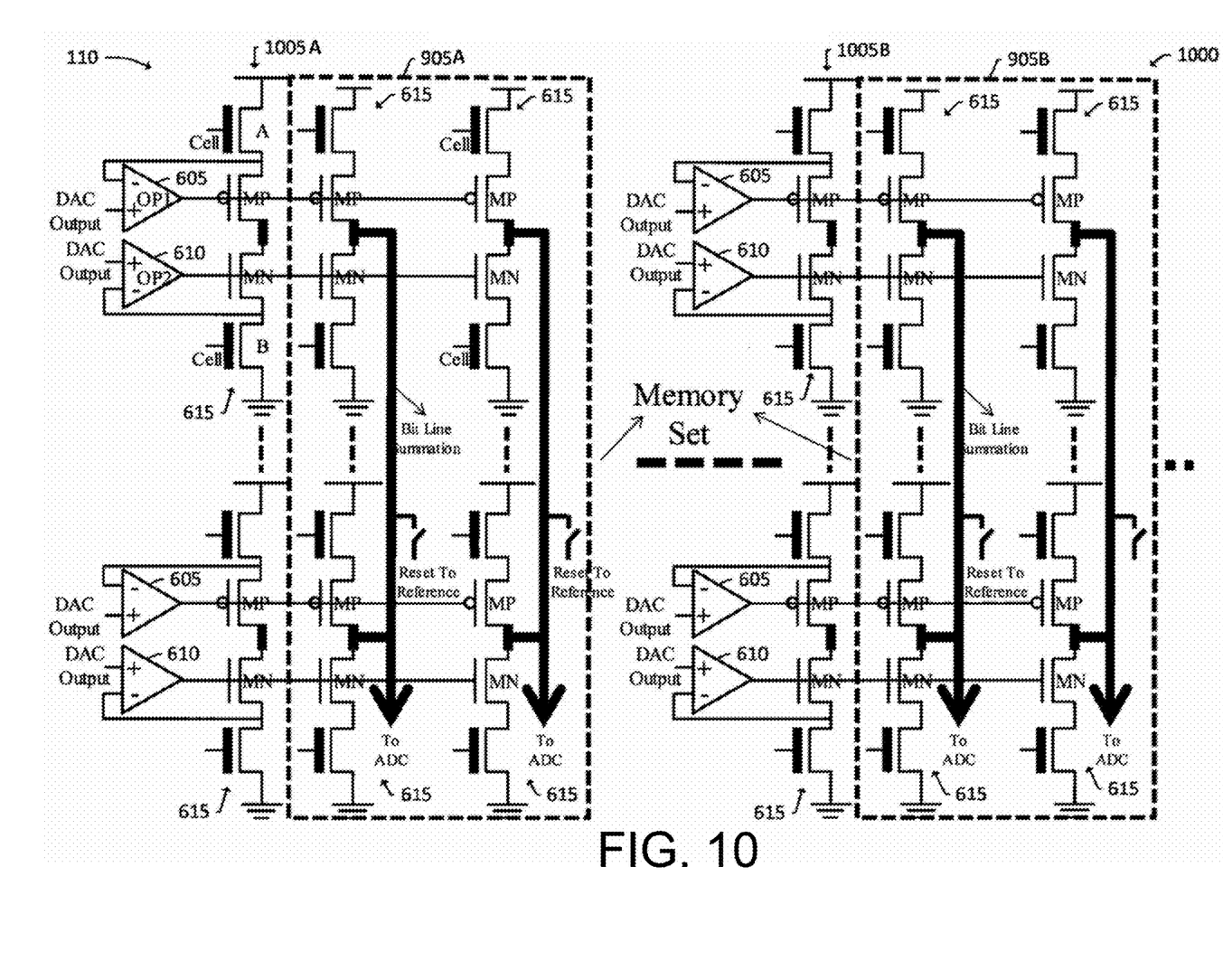
FIG. 10 is a circuit diagram illustrating another example computing device in accordance with some embodiments.
Figure 11A:
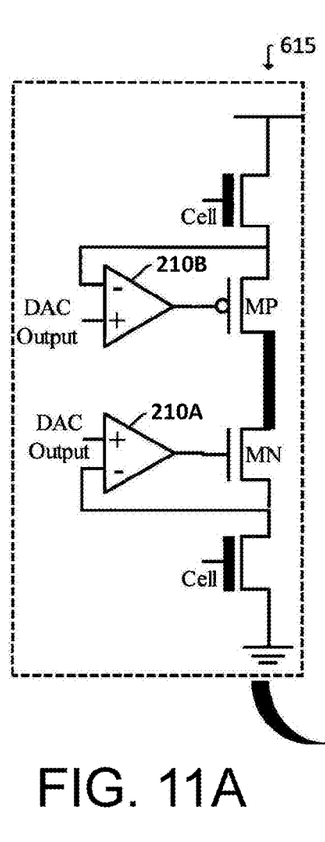
FIG. 11A shows a circuit diagram illustrating the charging portion of an example charge/discharge based input cell device including a PMOS charge cell in accordance with some embodiments.
Figure 11B:
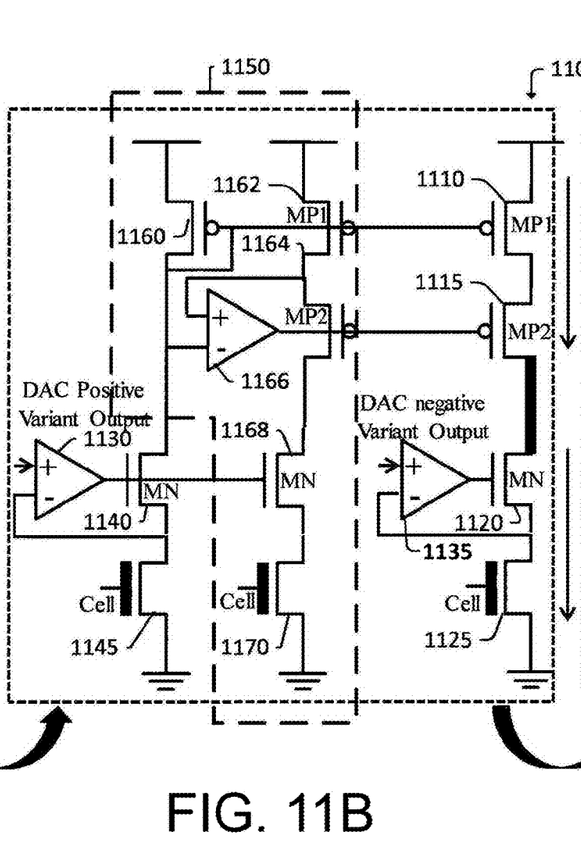
FIG. 11B shows a charging portion of charge/discharge arrangement the can be used to replace the circuit shown in FIG. 11A in accordance with some embodiments.
Figure 11C:
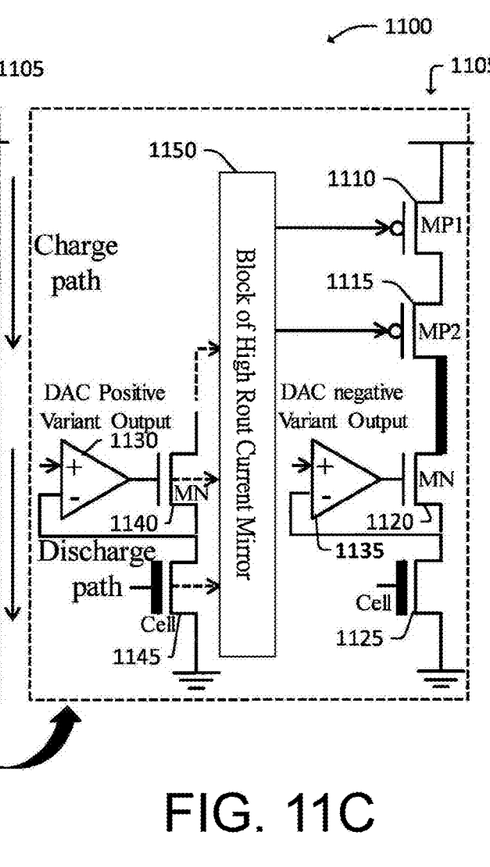
FIG. 11C shows the circuit shown in FIG. 11B but with a portion replaced by a block of high-output-impedance current mirror.

In some embodiments, as shown in FIGS. 11A, 11B and 11C, the charging portion of the charge/discharge arrangement (615) (FIG. 11A) can be replaced (FIG. 11B) by a current cell (1150) including a current mirror including PMOS (1160), OPAMP (1166) and PMOS cascode (1162, 1164) and switching NMOS (1168). The column of replica bit cells (FIG. 10) can be replaced by a replica bit cell structure (1105), which in this example includes PMOS cascode (1110, 1115), a current source including a switching NMOS (1120) driven by an OPAMP (1135), which receives an inverted (negative) DAC output.

In certain further embodiments (FIG. 11C, 1100) and more generally, the structure (1150) can be replaced by a block of high-output-impedance current mirror (1150).

Figure 12:
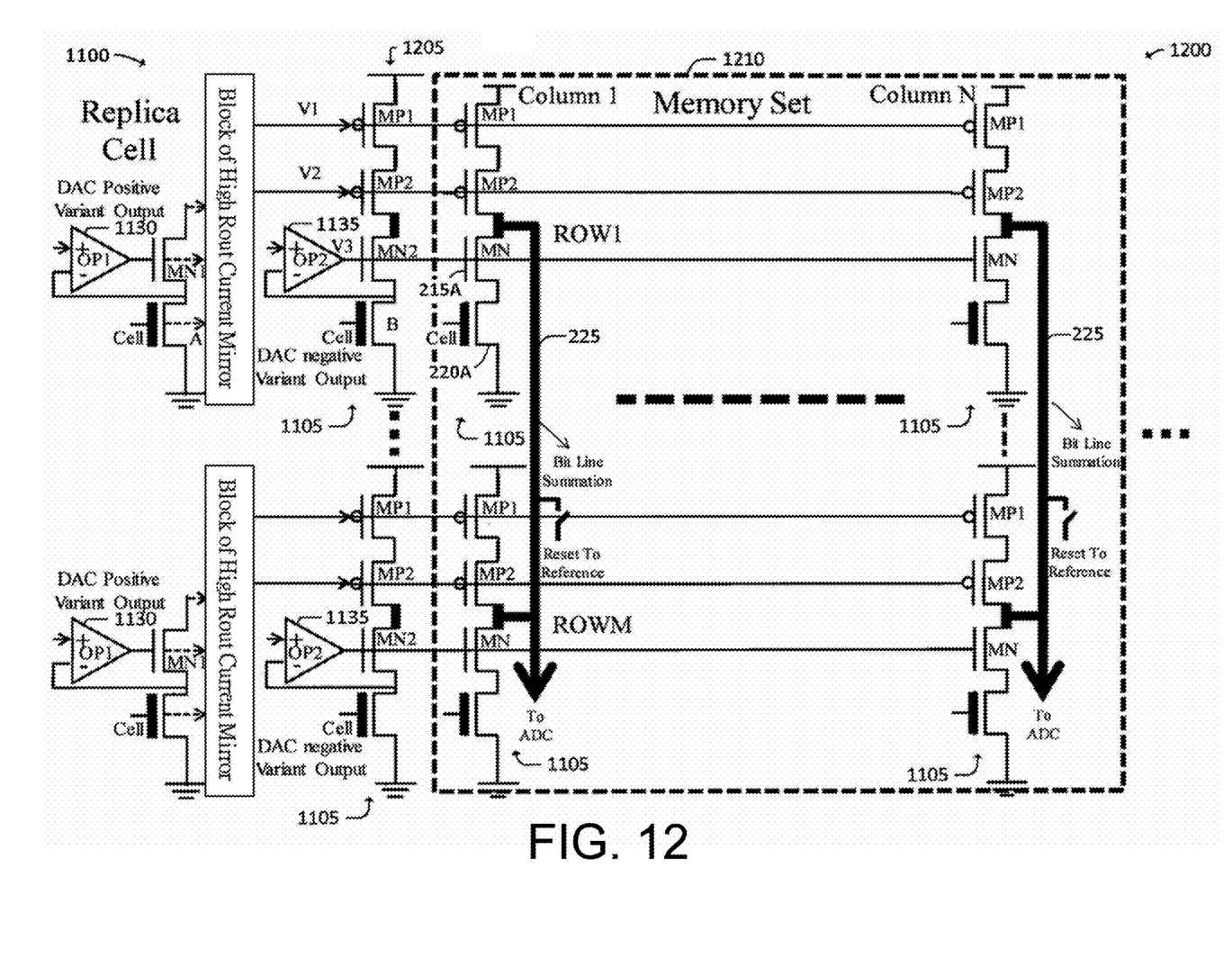
FIG. 12 is a circuit diagram illustrating another example computing device in accordance with some embodiments.

In some embodiments, such as the computing device (1200) shown in FIG. 12, the charge/discharge current circuit (1100), including the replica bit cell (1105) are used to drive the memory set (1210). Each column (column 1 through column N) in the set (1210) is structurally identical to that of the replica bit cell column (1205) but also connected to a respective bit line (225). In addition, in some embodiments, memory set (1210) can be repeated, or divided to form multiple sets, in similar fashion to the computing devices shown in FIGS. 4, 5, 9 and 10.

Certain examples of the computing device and methods described in the present disclosure provide improved computational speed, at least for certain types of computations, such as MAC, by utilizing analog computation, with reduced device size due to the elimination of components, such as capacitors, needed to compensate for current non-uniformity. Power consumption can be minimized by using lower voltage (Vref as opposed to VDD) for the OPAMPS and time-variant output of DACs.

In accordance with some disclosed embodiments, a computing device includes an array (e.g., a column) of memory elements; a conductive line extending along the array; and an array of transistors (e.g., metal-oxide-semiconductor ("MOS") transistors such as MOS field-effect transistors ("MOSFETs")), each paired with a respective one of the memory elements. Each of the memory element-transistor pair forms a serial combination with (e.g., the source-drain path of an eflash device in series with the source-drain path of a MOS transistor); the serial combination is connected between a first voltage reference point (e.g., ground) and the conductive line. The computing device further includes an array of amplifiers (e.g., OPAMP, such as StrongARM), with the output of each of the amplifiers connected to the control end of a respective transistor in the array.

In accordance with some disclosed embodiments, a computing device includes: a first set of memory elements arranged in a column; a first set of transistors serially connected the respective memory elements, the serial combination being switchably connected between a first voltage reference point and a second voltage reference point; a set of amplifiers, each having an output end connected to the control end of a respective one of the first plurality of the transistors; a second set of memory elements arranged in a column; a conductive line extending parallel to columns; a second set of transistors serially connected to the respective second set of memory elements, the serial combination being connected between the first voltage reference point and the conductive line, the output end of each of the first set of amplifiers being connected to the control end of a respective one of the second set of the transistors.

According to some embodiments, a computing method includes converting an array of digital (binary) numbers to an array of analog signals, each having an ON-period, the length of which corresponds to the respective number; generating a set of currents, each through a respective one of a memory cell in an array of memory cells, each of which in a respective memory state (e.g., 1 or 0), each of the currents having a magnitude corresponding to a combination of respective number and the memory state of the respective memory cell (e.g., the product between the number and the value or weight (1 or 0) stored in the memory cell). The method further includes generating an analog signal (e.g., a voltage) on a conductive line by charging or discharging the conductive line with the currents; and converting the analog signal to a first digital output signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A computing device, comprising:
 a first plurality of memory elements arranged in a first array extending in a first direction and each including two ends and a current path between the two ends;
 a first conductive line extending along the first array;
 a first plurality of transistors each having a source, a drain and a current path between the source and drain, and a gate, wherein the current path of each of the first plurality of transistors forms a serial combination with the current path of a respective one of the first plurality of memory elements, the serial combination being connected between a first voltage reference point and the first conductive line; and a first plurality of amplifiers, each having an output end connected to the gate of a respective one of the first plurality of transistors, wherein the serial combination of the current path of each of the first plurality of transistors and the current path of the respective one of the first plurality of memory elements is connected to the first conductive line at a respective first junction of a plurality of first junctions, the computing device further comprising a first plurality of switching devices each configured to connect a respective one of the plurality of first junctions to a second voltage reference point, wherein the computing device is configured to charge and discharge the first conductive line, in alternating charging and discharging cycles, by a current through each one of the first plurality of switching devices and a current through each one of the first plurality of transistors, respectively.

2. The computing device of claim 1, wherein each of the memory element comprises a resistive memory element.

3. The computing device of claim 1, further comprising a first analog-to-digital converter (ADC), the first conductive line being connected to an input end of the ADC.

4. The computing device of claim 3, further comprising a first plurality of digital-to-analog converters (DACs), each of which has an output connected to an input of a respective one of the first plurality of amplifiers.

5. The computing device of claim 4, wherein each of the first plurality of DACs is configured to output to the respective one of the first plurality of amplifiers a timing-variant signal.

6. The computing device of claim 5, wherein each of the first plurality of DACs is configured to receive a digital input having a value, and output to the respective one of the plurality of amplifiers an analog signal for a time period corresponding to the value of the digital input.

7. The computing device of claim 1, wherein the first voltage reference point is ground, and the second voltage reference point is at a rail voltage.

8. The computing device of claim 1, further comprising:

a second plurality of memory elements arranged in a second array extending in the first direction and pairwise spaced apart from the first plurality of memory elements in a second direction, and each including two ends and a current path between the two ends, the first and second pluralities of memory element being arranged in columns and rows of a two-dimensional array, with each column extending in the first direction and comprising one of the first and second arrays, and each row extending in the second direction;

a second conductive line extending in the first direction; and a second plurality of transistors each having a source, a drain and a current path between the source and drain, and a gate, the current path of each of the second plurality of transistors forming a serial combination with the current path of a respective one of the second plurality of memory elements, the serial combination being connected between a first voltage reference point and the second conductive line, the output end of each of the first plurality of amplifiers being connected to the gate of a respective one of the second plurality of the transistors.

9. A computing device comprising a plurality of computing devices of claim 8 spaced apart from each other in the second direction, the pluralities of the memory devices in the plurality of computing devices forming a two-dimensional array, wherein the plurality of amplifiers having their outputs connected to the transistors in each row have a common input.

10. The computing device of claim 9, wherein the serial combination of the current path of each of the first and second pluralities of transistors in each of the computing devices and the current path of the respective memory elements is connected to a respective one of the conductive lines at a respective junction point, the junction points arranged in columns associated with the respective columns of memory devices, and rows associated with the respective rows of memory devices, the computing device further comprising a plurality of switching devices each configured to connect a respective one of the junction points to the second voltage reference point, wherein the switching devices connecting the junction points in each respective row to the second voltage reference point are configured to be commonly operated.

11. The computing device of claim 1, wherein the first plurality of switching devices comprises a second plurality of transistors each having source, a drain and a current path between the source and drain, and a gate, and the computing device further comprises:

a second plurality of memory elements each associated with a corresponding one of the first plurality of memory elements and each including two ends and a current path between the two ends, wherein the current path of each of the second plurality of transistors forms a serial combination with the current path of a respective one of the second plurality of memory elements, the serial combination being connected between the second voltage reference point and the first conductive line; and a second plurality of amplifiers, each having an output end connected to the gate of a respective one of the second plurality of transistors.

12. The computing device of claim 11, wherein the source or drain of each of the first plurality of transistors and the drain or source of a respective one of the second plurality of transistors are adjacent to, and connected to, each other and connected to the first conductive line.

13. A computing device, comprising:

a first plurality of memory elements arranged in a first array extending in a first direction and each including two ends and a current path between the two ends;

a first conductive line extending along the first array;

a first plurality of transistors each having a source, a drain and a current path between the source and drain, and a gate, wherein the current path of each of the first plurality of transistors forms a serial combination with the current path of a respective one of the first plurality of memory elements, the serial combination being connected between a first voltage reference point and the first conductive line; and a first plurality of operational amplifiers (OPAMPs), each having an output end connected to the gate of a respective one of the first plurality of transistors.

14. The computing device of claim 13, wherein the OPAMP has a differential input having two input ends, one of which is connected to the source or drain of the respective transistor and an end of the current path of the respective memory element.

15. A computing device, comprising:
a first plurality of memory elements arranged in a first array extending in a first direction and each including two ends and a current path between the two ends;
a first conductive line extending in the first direction;
a first plurality of transistors each having a source, a drain and a current path between the source and drain, and a gate, the current path of each of the first plurality of transistors forming a serial combination with the current path of a respective one of the first plurality of memory elements the serial combination being switchably connected between a first voltage reference point and the first conductive line;
a first plurality of amplifiers, each having an output end connected to the gate of a respective one of the first plurality of the transistors;
a second plurality of memory elements arranged in an array extending in the first direction, each including two ends and a current path between the two ends; and
a second plurality of transistors each having a source, a drain and a current path between the two current-carrying ends, and a gate, wherein the current path of each of the second plurality of transistors forms a serial combination with the current path of a respective one of the second plurality of memory elements, the serial combination being connected between a second voltage reference point and the first conductive line, the output end of each of a second plurality of amplifiers being connected to the gate of a respective one of the second plurality of the transistors, wherein the computing device is configured to charge and discharge the first conductive line, in alternating charging and discharging cycles, by a current through each one of the second plurality of transistors and a current through each one of the first plurality of transistors, respectively.

16. The computing device of claim 15, further comprising:
a first plurality of digital-to-analog converters (DACs), each of which has an output connected to an input of a respective one of the first plurality of amplifiers; and
a first analog-to-digital converter (ADC), the first conductive line being connected to an input end of the first ADC.

17. The computing device of claim 16, wherein each of the first plurality of DACs is configured to output to the respective one of the first plurality of amplifiers a timing-variant signal.

18. The computing device of claim 17, wherein each of the first plurality of DACs is configured to receive a digital input having a value, and output to the respective one of the plurality of amplifiers an analog signal for a time period corresponding to the value of the digital input.

19. A method of computing, comprising:
converting a first plurality of digital input signals, each indicative a respective first number, to a first respective plurality of analog signals, each having an ON-period, the length of which is indicative of the respective first number;
generating a first plurality of currents, each through a respective one of a first plurality of memory cells, each of which in a respective memory state, each of the first plurality of currents having a magnitude indicative of a combination of a respective one of the first numbers and the state of the respective memory cell;
generating a first analog signal on a conductive line by charging or discharging the conductive line with the first plurality of currents; and
converting the first analog signal to a first digital output signal.

20. The method of claim 19, further comprising:
converting a second plurality of digital input signals, each indicative a respective second number, to a second respective plurality of analog signals, each having an ON-period, the length of which is indicative of the respective second number;
generating a second plurality of currents, each through a respective one of a second plurality of memory cells, each of which in a respective memory state, each of the second plurality of currents having a magnitude indicative of a combination of a respective one of the second numbers and the state of the respective memory cell;
generating a second analog signal on the conductive line by discharging the conductive line with the second plurality of currents if the generating the first analog signal is carried out by charging the conductive line with first plurality of currents, or by charging the conductive line with the second plurality of currents if the generating the first analog signal is carried out by discharging the conductive line with first plurality of currents; and
converting the second analog signal to a second digital output signal.

* * * * *

UNITED STATES PATENT AND TRADEMARK OFFICE
CERTIFICATE OF CORRECTION

PATENT NO. : 11,145,339 B2  
APPLICATION NO. : 16/881380  
DATED : October 12, 2021  
INVENTOR(S) : Jaw-Juinn Horng et al.

Page 1 of 1

It is certified that error appears in the above-identified patent and that said Letters Patent is hereby corrected as shown below:

On the Title Page

On the page 2, in Column 1, under "Other Publications", Line 2, delete "Internatinoal" and insert -- International --, therefor.

In the Specification

In Column 4, Line 38, delete "how." and insert -- $I_{200'}$. --, therefor.

In Column 5, Line 7, delete "(notshown)" and insert -- (not shown) --, therefor.

In the Claims

In Column 9, Line 48, in Claim 8, delete "element" and insert -- elements --, therefor.

Signed and Sealed this  
Twenty-fifth Day of January, 2022

Drew Hirshfeld  
*Performing the Functions and Duties of the*  
*Under Secretary of Commerce for Intellectual Property and*  
*Director of the United States Patent and Trademark Office*